(12) United States Patent
Katoh et al.

(10) Patent No.: US 10,375,837 B2
(45) Date of Patent: Aug. 6, 2019

(54) METHOD OF MANUFACTURING A CERAMIC SUBSTRATE

(71) Applicant: NGK SPARK PLUG CO., LTD., Nagoya-shi, Aichi (JP)

(72) Inventors: Tatsuya Katoh, Nagoya (JP); Masanori Ito, Nagoya (JP); Masaki Kutsuna, Ohbu (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 15/543,264

(22) PCT Filed: Jan. 8, 2016

(86) PCT No.: PCT/JP2016/000080
§ 371 (c)(1),
(2) Date: Jul. 13, 2017

(87) PCT Pub. No.: WO2016/114119
PCT Pub. Date: Jul. 21, 2016

(65) Prior Publication Data
US 2018/0035537 A1 Feb. 1, 2018

(30) Foreign Application Priority Data

Jan. 13, 2015 (JP) .................................. 2015-003819

(51) Int. Cl.
*H01K 3/22* (2006.01)
*H05K 3/40* (2006.01)
(Continued)

(52) U.S. Cl.
CPC .............. *H05K 3/40* (2013.01); *B32B 9/005* (2013.01); *C03C 4/14* (2013.01); *C03C 10/0054* (2013.01);
(Continued)

(58) Field of Classification Search
CPC . H01L 23/15; H01L 23/49883; H05K 3/1291; H05K 3/46; C23C 18/08;
(Continued)

(56) References Cited

U.S. PATENT DOCUMENTS

| | | | | |
|---|---|---|---|---|
| 5,474,619 A | * | 12/1995 | Kreider | ................... H01L 35/08 136/201 |
| 2007/0023388 A1 | * | 2/2007 | Nair | ......................... H01B 1/22 216/13 |

FOREIGN PATENT DOCUMENTS

| | | |
|---|---|---|
| JP | H05-298918 A | 11/1993 |
| JP | H06-019926 B2 | 3/1994 |

(Continued)

OTHER PUBLICATIONS

Japan Patent Office, Office Action issued in corresponding Application No. JP 2016-541726, dated Jun. 20, 2017.

(Continued)

*Primary Examiner* — Thiem D Phan
(74) *Attorney, Agent, or Firm* — Stites & Harbison, PLLC; Jeffrey A. Haeberlin; James R. Hayne

(57) ABSTRACT

A method of manufacturing a ceramic substrate includes the steps of preparing a ceramic paste in which a powder of at least one of a metal boride and a metal silicide is added to a raw material powder of a glass ceramic, applying the ceramic paste to a green sheet which is to become a ceramic layer after firing, applying a conductor paste which is to become a conductor trace after firing to the ceramic paste having been applied to the green sheet, and firing the green sheet carrying the ceramic paste and the conductor paste applied thereto.

4 Claims, 3 Drawing Sheets

(51) Int. Cl.
*H05K 1/09* (2006.01)
*H05K 3/12* (2006.01)
*H05K 3/28* (2006.01)
*H05K 3/46* (2006.01)
*C03C 4/14* (2006.01)
*C03C 10/00* (2006.01)
*H05K 1/03* (2006.01)
*H05K 1/02* (2006.01)
*H05K 3/32* (2006.01)
*C04B 35/63* (2006.01)
*H01L 23/15* (2006.01)
*B32B 9/00* (2006.01)

(52) U.S. Cl.
CPC .......... *C04B 35/6303* (2013.01); *H01L 23/15* (2013.01); *H05K 1/0296* (2013.01); *H05K 1/0306* (2013.01); *H05K 1/09* (2013.01); *H05K 1/092* (2013.01); *H05K 3/12* (2013.01); *H05K 3/1291* (2013.01); *H05K 3/28* (2013.01); *H05K 3/285* (2013.01); *H05K 3/321* (2013.01); *H05K 3/4061* (2013.01); *H05K 3/46* (2013.01); *H05K 3/4664* (2013.01); *B32B 2307/202* (2013.01); *C03C 2204/00* (2013.01); *C04B 2237/40* (2013.01); *C04B 2237/704* (2013.01); *H05K 3/4629* (2013.01); *H05K 2201/017* (2013.01); *H05K 2201/0769* (2013.01); *H05K 2203/1126* (2013.01); *Y10T 29/49163* (2015.01)

(58) Field of Classification Search
CPC ....... Y10T 29/49163; Y10T 428/31678; Y10T 428/24917
USPC .......................... 29/851, 825, 829, 830, 846
See application file for complete search history.

(56) References Cited

FOREIGN PATENT DOCUMENTS

| | | | |
|---|---|---|---|
| JP | H06-252524 | A | 9/1994 |
| JP | H07-135394 | A | 5/1995 |
| JP | H09-246722 | A | 9/1997 |
| JP | 11066951 | * | 3/1999 |
| JP | H11-066951 | A | 3/1999 |
| JP | H11-339560 | A | 12/1999 |
| JP | 2001-278657 | * | 10/2001 |
| JP | 2001-278657 | A | 10/2001 |
| JP | 2006-073280 | A | 3/2006 |
| JP | 2006-253600 | A | 9/2006 |
| JP | 2007-059390 | A | 3/2007 |
| JP | 4797534 | B2 | 3/2007 |
| JP | 2007-234537 | A | 9/2007 |
| JP | 2014-179473 | A | 9/2014 |
| WO | 2014-026910 | A1 | 2/2014 |

OTHER PUBLICATIONS

Japan Patent Office, Office Action issued in corresponding Application No. JP 2016-541738, dated Jun. 20, 2017.
Japan Patent Office, International Search Report issued in corresponding Application No. PCT/JP2016/000080, dated Apr. 5, 2016.
Japan Patent Office, Written Opinion issued in corresponding Application No. PCT/JP2016/000080, dated Apr. 5, 2016.
The State Intellectual Property Office of the People's Republic of China, The First Office Action issued in corresponding Application No. 201680005805.2, dated Oct. 31, 2018.
Korean Intellectual Property Office, Office Action (Notification of Reason for Refusal) issued in corresponding Application No. 10-2017-7019496 dated Dec. 6, 2018.

* cited by examiner

| Sample | Ceramic Paste | | Primary Material | Firing Temperature (°C) | Silver Diffusion Distance (μm) | Evaluation |
| --- | --- | --- | --- | --- | --- | --- |
| | Additive | | | | | |
| | Material | Amount (vol.%) | | | | |
| S01 | LaB$_6$ | 5 | SiO$_2$-B$_2$O$_3$-CaO glass + Al$_2$O$_3$ | 850 | Less than 5 | AA |
| S02 | SiB$_6$ | 5 | SiO$_2$-B$_2$O$_3$-CaO glass + Al$_2$O$_3$ | 850 | Less than 5 | AA |
| S03 | TiB$_2$ | 5 | SiO$_2$-B$_2$O$_3$-CaO glass + Al$_2$O$_3$ | 850 | Less than 5 | AA |
| S04 | TiSi$_2$ | 5 | SiO$_2$-B$_2$O$_3$-CaO glass + Al$_2$O$_3$ | 850 | Less than 5 | AA |
| S05 | ZrSi$_2$ | 5 | SiO$_2$-B$_2$O$_3$-CaO glass + Al$_2$O$_3$ | 850 | Less than 5 | AA |
| S06 | TaSi$_2$ | 5 | SiO$_2$-B$_2$O$_3$-CaO glass + Al$_2$O$_3$ | 850 | Less than 5 | AA |
| S07 | LaB$_6$ | 7 | SiO$_2$-B$_2$O$_3$-CaO glass + Al$_2$O$_3$ | 850 | Less than 5 | AA |
| S08 | LaB$_6$ | 3 | SiO$_2$-B$_2$O$_3$-CaO glass + Al$_2$O$_3$ | 850 | Less than 5 | AA |
| S09 | None | - | SiO$_2$-B$_2$O$_3$-CaO glass + Al$_2$O$_3$ | 850 | Greater than 40 | XX |

FIG. 3

METHOD OF MANUFACTURING A CERAMIC SUBSTRATE

TECHNICAL FIELD

The present invention relates to a ceramic substrate and to a method of manufacturing the same.

BACKGROUND ART

There has been known a ceramic substrate having a ceramic layer mainly formed of a glass ceramic and a conductor trace containing silver (Ag) as a main component. Such a ceramic substrate is formed by applying a conductor paste which is the pre-firing form of the conductor trace to a green sheet which is the pre-firing form of the ceramic layer and firing the green sheet carrying the conductor paste applied thereto. Such a ceramic substrate is also called a low temperature co-fired ceramic (LTCC) substrate.

When the ceramic substrate is formed by firing, the silver component of the conductor paste diffuses into the ceramic layer. This may cause, for example, formation of voids in the ceramic layer, deformation of the ceramic layer, and change of color of the ceramic layer. It is considered that diffusion of the silver component into the ceramic layer is accelerated by oxidation of the silver component of the conductor trace.

Patent Document 1 discloses a technique of preventing diffusion of the silver component into the ceramic layer by covering the surfaces of silver powder particles contained in the conductor paste with an antimony salt. Patent Document 2 discloses a technique of preventing diffusion of the silver component into the ceramic layer by adding silicon powder to the conductor paste.

PRIOR ART DOCUMENTS

Patent Documents

Patent Document 1: Japanese Patent Application Laid-Open (kokai) No. H6-252524
Patent Document 2: Japanese Patent Application Laid-Open (kokai) No. 2007-234537

SUMMARY OF THE INVENTION

Problem to be Solved by the Invention

However, the techniques disclosed in Patent Documents 1 and 2 cannot sufficiently prevent diffusion of the silver component of the conductor paste into the ceramic layer in some cases.

Means for Solving the Problem

The present invention has been accomplished to solve the above-described problem. The present invention can be realized as follows.

(1) One mode of the present invention is a method of manufacturing a ceramic substrate including a ceramic layer mainly formed of a glass ceramic and a conductor trace mainly formed of silver (Ag). The manufacturing method includes the steps of preparing a ceramic paste in which a powder of at least one of a metal boride and a metal silicide is added to a raw material powder of the glass ceramic, applying the ceramic paste to a green sheet which is to become the ceramic layer after firing, applying a conductor paste which is to become the conductor trace after firing to the ceramic paste having been applied to the green sheet, and firing the green sheet carrying the ceramic paste and the conductor paste applied thereto. According to this mode, at least one of the metal boride and the metal silicide added to the ceramic paste oxidizes during firing. Therefore, diffusion of the silver component of the conductor trace into the ceramic layer can be prevented. As a result, it is possible to prevent problems caused by diffusion of the silver component, for example, formation of voids in the ceramic layer, deformation of the ceramic layer, or change of color of the ceramic layer. Thus, the quality of the ceramic substrate can be improved.

(2) In the manufacturing method of the above-described mode, the metal boride may be at least one of lanthanum hexaboride ($LaB_6$), silicon hexaboride ($SiB_6$), and titanium diboride ($TiB_2$). This mode prevents diffusion of the silver component from the conductor trace into the ceramic layer.

(3) In the manufacturing method of the above-described mode, the metal silicide may be at least one of titanium disilicide ($TiSi_2$), zirconium disilicide ($ZrSi_2$), and tantalum disilicide (TaSi2). This mode prevents diffusion of the silver component from the conductor trace into the ceramic layer.

(4) In the manufacturing method of the above-described mode, the total amount of the metal boride and the metal silicide with respect to the amount of the inorganic component of the ceramic paste may be 3 vol. % to 7 vol. %. This mode sufficiently prevents diffusion of the silver component from the conductor trace into the ceramic layer.

(5) In the manufacturing method of the above-described mode, the raw material powder of the glass ceramic may contain borosilicate glass powder and alumina ($Al_2O_3$) powder. This mode can improve the quality of the borosilicate glass-based ceramic substrate.

(6) Another mode of the present invention is a method of manufacturing a ceramic substrate including a ceramic layer mainly formed of a glass ceramic and a conductor trace mainly formed of silver (Ag). The manufacturing method includes the steps of preparing a ceramic slurry in which a powder of at least one of a metal boride and a metal silicide is added to a raw material powder of the glass ceramic, making from the ceramic slurry a green sheet which is become the ceramic layer after firing, applying a conductor paste which is to become the conductor trace after firing to the green sheet, and firing the green sheet carrying the conductor paste applied thereto. According to this mode, at least one of the metal boride and the metal silicide contained in the green sheet oxidizes during firing. Therefore, diffusion of the silver component of the conductor trace into the ceramic layer can be prevented. As a result, it is possible to prevent problems caused by diffusion of the silver component, for example, formation of voids in the ceramic layer, deformation of the ceramic layer, or change of color of the ceramic layer. Thus, the quality of the ceramic substrate can be improved.

(7) Still another mode of the present invention is a ceramic substrate including a plurality of ceramic layers mainly formed of a glass ceramic and a conductor trace mainly formed of silver (Ag). The ceramic layers include a first ceramic layer which is located adjacent to the conductor trace and a second ceramic layer which sandwiches the first ceramic layer in cooperation with the conductor trace. The concentration of silicon atoms (Si) and/or boron atoms (B) in the first ceramic layer is higher than that in the second ceramic layer. This mode prevents problems caused by diffusion of the silver component, for example, formation of voids in the ceramic layers, deformation of the ceramic layers, or change of color of the ceramic layers. Thus, the quality of the ceramic substrate can be improved.

The present invention is not limited to the ceramic substrate and the method of manufacturing the same, and may be realized in various other forms. For example, the present invention can be realized as an apparatus including a ceramic substrate or a manufacturing apparatus for manufacturing a ceramic substrate.

BRIEF DESCRIPTION OF THE DRAWINGS

FIG. 3 Table showing the results of an evaluation test.

MODES FOR CARRYING OUT THE INVENTION

A. Embodiment

Figure 1:
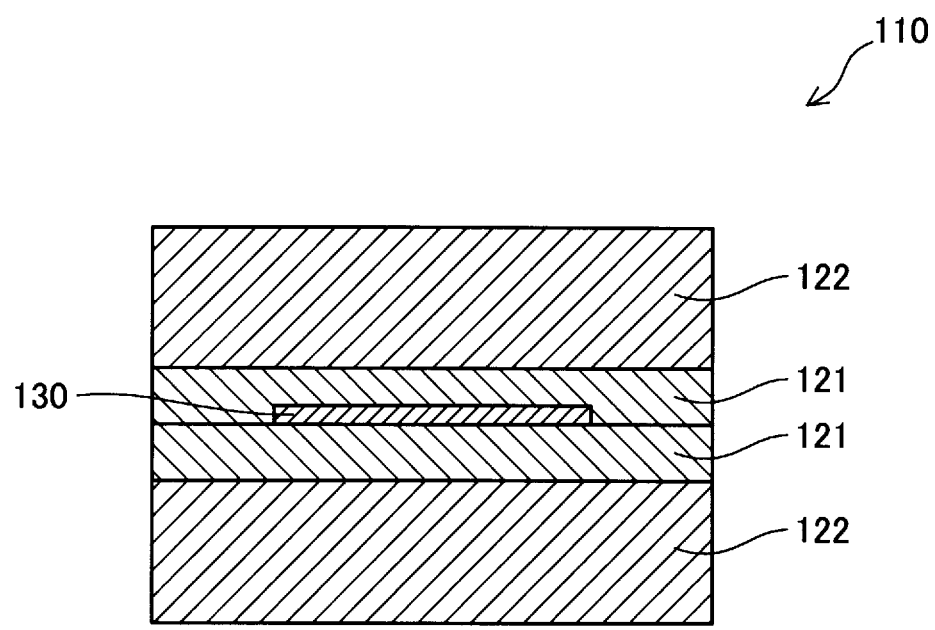
FIG. 1 Explanatory view schematically showing a cross section of a ceramic substrate.

FIG. 1 is an explanatory view schematically showing a cross section of a ceramic substrate 110. The ceramic substrate 110 is a low temperature co-fired ceramic (LTCC) substrate. At least a portion of a circuit for realizing a predefined function is formed on the ceramic substrate 110. In the present embodiment, a circuit for transmitting a signal to electronic components, etc. is formed in the ceramic substrate 110.

The ceramic substrate 110 includes ceramic layers 121 and 122 and a conductor trace 130. The ceramic substrate 110 has a structure in which the plurality of ceramic layers 121 and 122 are laminated. In the present embodiment, the ceramic substrate 110 has unillustrated vias and unillustrated through holes in addition to the conductor trace 130 as conductors which form the circuit.

Each of the ceramic layers 121 of the ceramic substrate 110 is a first ceramic layer which is located adjacent to the conductor trace 130. The ceramic layers 121 have electrically insulating properties. The ceramic layers 121 are mainly formed of a glass ceramic. In this description, "mainly formed of (a component)" means that the component accounts for at least 50 mass % of the entirety. In the present embodiment, each of the ceramic layers 121 is a ceramic layer which is formed by firing borosilicate glass powder and alumina ($Al_2O_3$) powder. Borosilicate glass is mainly composed of silicon dioxide ($SiO_2$), alumina ($Al_2O_3$), and boron oxide ($B_2O_3$). A powder of at least one of a metal boride and a metal silicide is added to a ceramic paste which is the pre-firing form of the ceramic layer 121. Therefore, the concentration of silicon atoms (Si) and/or boron atoms (B) in the ceramic layers 121 is higher than that in the ceramic layers 122. In the present embodiment, each of the ceramic layers 121 has a thickness of about 10 μm.

Each of the ceramic layers 122 of the ceramic substrate 110 is a ceramic layer which sandwiches the corresponding ceramic layer 121 in cooperation with the conductor trace 130. The ceramic layers 122 have electrically insulating properties. The ceramic layers 122 are mainly formed of a glass ceramic. In the present embodiment, like the ceramic layers 121, each of the ceramic layers 122 is formed by firing borosilicate glass powder and alumina ($Al_2O_3$) powder. In the present embodiment, unlike the ceramic layers 121, a powder of at least one of the metal boride and the metal silicide is not added to each of green sheets which are the pre-firing form of the ceramic layers 122. Each of the ceramic layers 122 has a thickness sufficiently greater than that of the ceramic layers 121.

The conductor trace 130 of the ceramic substrate 110 is mainly formed of silver (Ag). In the present embodiment, the conductor trace 130 contains silver (Ag) powder and borosilicate glass powder, and has electrical conductivity. In the present embodiment, the conductor trace 130 has a thickness of about 10 μm.

In the present embodiment, the conductor trace 130 is sandwiched between the two ceramic layers 121 and is located adjacent to the two ceramic layers 121. In another embodiment, the conductor trace 130 may be sandwiched between the ceramic layers 121 and 122 and be located adjacent to the ceramic layers 121 and 122. In still another embodiment, the ceramic substrate 110 may include two or more conductor traces 130 which are laminated together with other ceramic layers 121 and 122.

Figure 2:
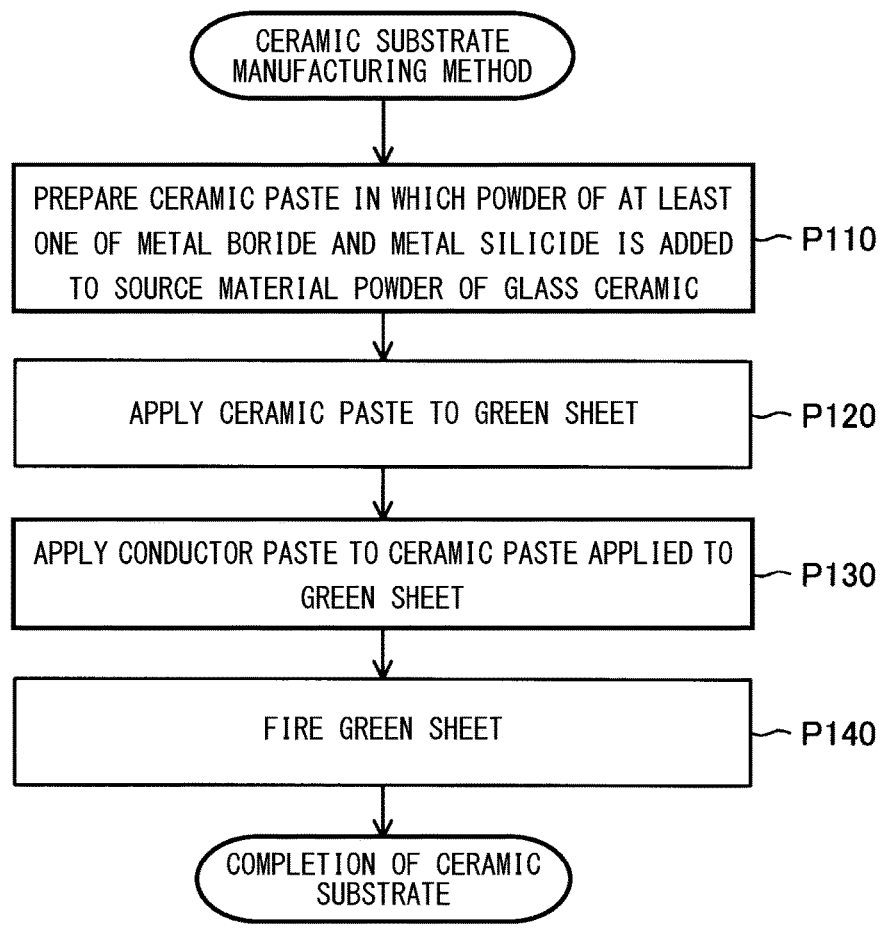
FIG. 2 Flowchart showing a method of manufacturing the ceramic substrate.

FIG. 2 is a flowchart showing a method of manufacturing the ceramic substrate 110. First, a ceramic paste which is the material of each ceramic layer 121 is prepared (step P110). The ceramic paste which is the material of each ceramic layer 121 is a paste in which a powder of at least one of the metal boride and the metal silicide is added to a raw material powder of a glass ceramic. In the present embodiment, the raw material powder of the ceramic paste is prepared by mixing borosilicate glass powder and alumina powder, which are inorganic components, at a volume ratio of 60:40.

From the viewpoint of preventing diffusion of silver into the ceramic layers 121 and 122, the metal boride to be added to the ceramic paste is preferably at least one of lanthanum hexaboride ($LaB_6$), silicon hexaboride ($SiB_6$), and titanium diboride ($TiB_2$). From the viewpoint of preventing diffusion of silver into the ceramic layers 121 and 122, the metal silicide to be added to the ceramic paste is preferably at least one of titanium disilicide ($TiSi_2$), zirconium disilicide ($ZrSi_2$), and tantalum disilicide ($TaSi_2$).

From the viewpoint of preventing diffusion of silver into the ceramic layers 121 and 122, the total amount of the metal boride and the metal silicide with respect to the amount of the inorganic component of the ceramic paste is preferably 3 vol. % to 7 vol. %.

In the present embodiment, a mixture of borosilicate glass powder and alumina powder, both of which are inorganic components, is prepared for producing the ceramic paste which is the material of each ceramic layer 121. Subsequently, a powder of at least one of the metal boride and the metal silicide, ethyl cellulose serving as a binder, and terpineol serving as a solvent are added to the mixture of the inorganic components. The resultant material is kneaded with a triple roll mill, whereby the ceramic paste is obtained.

After preparation of the ceramic paste, which is to become a ceramic layer 121 after firing (step P110), the ceramic paste is applied to a green sheet which is to become a ceramic layer 122 after firing (step P120). In the present embodiment, the ceramic paste is applied to the green sheet by means of screen printing.

As a preparation for applying the ceramic paste to the green sheet, the green sheet which is the material of each ceramic layer 122 is prepared. The green sheet is formed by mixing powders of inorganic components with a binder, a plasticizer, a solvent, etc., and forming the resultant mixture into the shape of a thin plate (sheet). In the present embodiment, powders of borosilicate glass and alumina which are inorganic components are weighed such that their volume ratio becomes 60:40 and the total weight becomes 1 kg. These powders are placed in a container (pot) formed of alumina. Subsequently, 120 g of acrylic resin serving as a binder, a proper amount of methyl ethyl ketone (MEK) serving as a solvent, and a proper amount of dioctyl phthalate (DOP) serving as a plasticizer are added to the materials (powders) in the pot. The materials in the pot are mixed for five hours to thereby obtain a ceramic slurry. Then, a green sheet is made from the ceramic slurry using the doctor blade method. In the present embodiment, the green sheet has a thickness of 0.15 mm.

After preparing the green sheet, the ceramic paste is applied to the green sheet. In the present embodiment, the green sheet carrying the ceramic paste applied thereto is formed into a desired shape by means of punching.

After the ceramic paste has been applied to the green sheet (step P120), a conductor paste which is to become the conductor trace 130 after firing is applied to the ceramic paste having been applied to the green sheet (step P130). In the present embodiment, the conductor paste which is to become the conductor trace 130 after firing is prepared by mixing a binder, a plasticizer, a solvent, etc. into a powder of inorganic components; i.e., a mixture of powder of silver (Ag) and powder of borosilicate glass. In the present embodiment, after ethyl cellulose serving as a binder and terpineol serving as a solvent are added to the powder of inorganic components, the resultant material is kneaded with a triple roll mill, whereby the conductor paste is obtained. Subsequently, the conductor paste is applied to the green sheet by means of screen printing and hole-filling printing.

After applying the conductor paste to the green sheet (step P130), the green sheet carrying the ceramic paste and the conductor paste applied thereto is fired (step P140). Thus, the ceramic substrate 110 is complete.

In the present embodiment, a plurality of green sheets are laminated to form a laminate before firing the green sheets. In the present embodiment, a green sheet carrying the ceramic paste applied thereto is placed on another green sheet carrying the ceramic paste and the conductor paste applied thereto such that the ceramic paste side of the former comes into contact with the conductor paste side of the latter, whereby the laminate is formed. In the present embodiment, by cutting operation, the laminate is formed into a shape suitable for firing. In the present embodiment, the laminate is exposed to an atmosphere of 250° C. for 10 hours for debindering. In the present embodiment, after debindering, the laminate is fired by being exposed to an atmosphere of 850° C. for 60 minutes. After these steps, the ceramic substrate 110 is obtained.

When the green sheet carrying the ceramic paste and the conductor paste applied thereto is fired, oxygen near the conductor paste is consumed by oxidation of the additive component(s) (at least one of the metal boride and the metal silicide) contained in the ceramic paste. As a result, oxidation of the silver component contained in the conductor paste is prevented. Thus, diffusion of the silver component into the ceramic layers 121 and 122 is prevented. Since the ceramic paste contains the additive component(s), the concentration of silicon atoms (Si) and/or boron atoms (B) in the ceramic layers 121 is higher than that in the ceramic layers 122 depending on the amount of the additive component(s).

FIG. 3 is a table showing the results of an evaluation test. In the evaluation test whose results are shown in FIG. 3, samples S01 to S09 of the ceramic substrate 110 were made through use of different ceramic pastes. In the table of FIG. 3, the amount of the additive in the ceramic paste which is the pre-firing form of the ceramic layer 121 is shown as the amount (volume percent) of the additive with respect to the amount of the inorganic component of the ceramic paste.

The method of preparing the samples S01 to S08 is the same as that described with reference to FIG. 2. The method of preparing the sample S09 is the same as that described with reference to FIG. 2 except that the metal boride and the metal silicide are not added to the ceramic paste.

A cross section of each sample was observed using a scanning electron microscope (SEM) and an electron probe micro analyzer (EPMA) to measure the distance of diffusion of silver into the ceramic layers 121 and 122. The concentration of silver (Ag) at the interface between the ceramic layer 121 and the conductor trace 130 was used as a reference concentration, and the distance between the interface and a position in the ceramic layers 121 and 122 at which the concentration of silver (Ag) becomes half the reference concentration was measured at 10 points. The average of the measured distances was obtained as a silver diffusion distance.

Each sample was evaluated on the basis of the following criteria.
AA (excellent): The silver diffusion distance is less than 5 μm.
XX (poor): The silver diffusion distance is equal to or greater than 5 μm.

The evaluation results of the samples S01 to S03 and S09 show that diffusion of silver into the ceramic layers 121 and 122 can be prevented by adding one of lanthanum hexaboride ($LaB_6$), silicon hexaboride ($SiB_6$), and titanium diboride ($TiB_2$), which are metal borides, to the ceramic paste which is the pre-firing form of the ceramic layer 121.

The evaluation results of the samples S04 to S06 and S09 show that diffusion of silver into the ceramic layers 121 and 122 can be prevented by adding one of titanium disilicide ($TiSi_2$), zirconium disilicide ($ZrSi_2$), and tantalum disilicide ($TaSi_2$), which are metal silicides, to the ceramic paste which is the pre-firing form of the ceramic layer 121.

The evaluation results of the samples S01 to S08 show that diffusion of silver into the ceramic layers 121 and 122 can be sufficiently prevented when the total amount of the metal boride and the metal silicide with respect to the amount of the inorganic component of the ceramic paste which is the pre-firing form of the ceramic layer 121 is 3 vol. % to 7 vol. %.

According to the embodiment described above, at least one of the metal boride and the metal silicide added to the ceramic paste oxidizes during firing. Therefore, diffusion of the silver component of the conductor trace 130 into the ceramic layers 121 and 122 can be prevented. As a result, it is possible to prevent problems caused by diffusion of the silver component, for example, formation of voids in the ceramic layers 121 and 122, deformation of the ceramic layers 121 and 122, or change of color of the ceramic layers 121 and 122. Thus, the quality of the ceramic substrate 110 can be improved.

The metal boride added to the ceramic paste may be at least one of lanthanum hexaboride ($LaB_6$), silicon hexaboride ($SiB_6$), and titanium diboride ($TiB_2$). This prevents diffusion of the silver component from the conductor trace 130 into the ceramic layers 121 and 122.

The metal silicide added to the ceramic paste may be at least one of titanium disilicide ($TiSi_2$), zirconium disilicide ($ZrSi_2$), and tantalum disilicide ($TaSi_2$). This prevents diffusion of the silver component from the conductor trace 130 into the ceramic layers 121 and 122.

When the total amount of the metal boride and the metal silicide with respect to the amount of the inorganic component of the ceramic paste is 3 vol. % to 7 vol. %, diffusion of the silver component from the conductor trace 130 into the ceramic layers 121 and 122 can be sufficiently prevented.

B. Other Embodiments

The present invention is not limited to the above-described embodiment and modifications, but may be embodied in various other forms without departing from the spirit of the invention. For example, in order to solve, partially or entirely, the above-mentioned problem or yield, partially or entirely, the above-mentioned effects, technical features of the embodiments and modifications corresponding to technical features of the modes described in the section "SUMMARY OF THE INVENTION" can be replaced or combined as appropriate. Also, the technical feature(s) may be eliminated as appropriate unless the present specification mentions that the technical feature(s) is mandatory.

In another embodiment, when the ceramic paste which is the pre-firing form of the ceramic layer 121 is prepared (step P110), before adding a binder and a solvent to the raw material powder, the powder of at least one of the metal boride and the metal silicide is caused to adhere to the surfaces of silver (Ag) powder particles by adding the powder of at least one of the metal boride and the metal silicide to the raw material powder. This prevents diffusion of the silver component from the conductor trace 130 into the ceramic layers 121 and 122 to a greater degree.

In still another embodiment, after preparing the ceramic slurry including a powder of at least one of the metal boride and the metal silicide added thereto, the ceramic slurry may be used to make a green sheet which is to become the ceramic layer 122 after firing. In this case, the ceramic paste which is to become the ceramic layer 121 after firing is not required to be applied to the green sheet. In this embodiment, the additive component contained in the green sheet (i.e., at least one of the metal boride and the metal silicide) oxidizes during firing. Therefore, diffusion of the silver component of the conductor trace 130 into the ceramic layer 122 can be prevented. As a result, it is possible to prevent problems caused by diffusion of the silver component, for example, formation of voids in the ceramic layer 122, deformation of the ceramic layer 122, or change of color of the ceramic layer 122. Thus, the quality of the ceramic substrate 110 can be improved.

DESCRIPTION OF REFERENCE NUMERALS

110 . . . ceramic substrate
121 . . . ceramic layer
122 . . . ceramic layer
130 . . . conductor trace

What is claimed is:

1. A method of manufacturing aced substrate including a ceramic layer mainly formed of a glass ceramic and a conductor trace mainly formed of silver (Ag), comprising:
   a step of preparing a ceramic paste in which a powder of at least one of a metal boride and a metal silicide is added to a raw material powder of the glass ceramic, the raw material powder of the glass ceramic comprising borosilicate glass powder and alumina ($Al_2O_3$) powder;
   a step of applying the ceramic paste to a green sheet which is to become the ceramic layer after firing;
   a step of applying a conductor paste which is to become the conductor trace after firing to the ceramic paste having been applied to the green sheet; and
   a step of firing the green sheet carrying the ceramic paste and the conductor paste applied thereto;
   wherein a total amount of the at least one of the metal boride and the metal silicide with respect to an amount of an inorganic component of the ceramic paste is 3 vol. % to 7 vol. % such that diffusion of a silver component of the conductor trace is prevented.

2. The method of manufacturing a ceramic substrate according to claim 1, wherein the powder includes metal boride that is at least one of lanthanum hexaboride ($LaB_6$), silicon hexaboride ($SiB_6$), and titanium diboride ($TiB_2$).

3. The method of manufacturing a ceramic substrate according to claim 1, wherein the powder includes metal silicide that is at least one of titanium disilicide ($TiSi_2$), zirconium disilicide ($ZiSi_2$), and tantalum disilicide ($TaSi_2$).

4. A method of manufacturing a ceramic substrate including a ceramic layer mainly formed of a glass ceramic and a conductor trace mainly formed of silver (Ag), comprising:
   a step of preparing a ceramic slurry in which a powder of at least one of a metal boride and a metal silicide is added to a raw material powder of the glass ceramic, the raw material powder of the glass ceramic comprising borosilicate glass powder and alumina ($Al_2O_3$) powder;
   a step of making from the ceramic slurry a green sheet which is to become the ceramic layer after firing;
   a step of applying a conductor paste which is to become the conductor trace after firing to the green sheet; and
   a step of firing the green sheet carrying the conductor paste applied thereto;
   wherein, a total amount of the at least one of the metal boride and the metal silicide with respect to an amount of an inorganic component of the ceramic slurry is 3 vol. % to 7 vol. % such that diffusion of a silver component of the conductor trace is prevented.

* * * * *